United States Patent
Tsai et al.

(10) Patent No.: US 11,337,331 B2
(45) Date of Patent: May 17, 2022

(54) HORIZONTALLY OPENING FRONT BAYS

(71) Applicant: Dell Products, L.P., Round Rock, TX (US)

(72) Inventors: Meng Ru Tsai, New Taipei (TW); Kun-Nan Chen, Taipei (TW); Ting Chun Fong, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/860,807

(22) Filed: Apr. 28, 2020

(65) Prior Publication Data

US 2021/0337694 A1    Oct. 28, 2021

(51) Int. Cl.
*H05K 7/14* (2006.01)
*G06F 1/18* (2006.01)

(52) U.S. Cl.
CPC ........... *H05K 7/1488* (2013.01); *G06F 1/183* (2013.01); *H05K 7/1427* (2013.01)

(58) Field of Classification Search
None
See application file for complete search history.

(56) References Cited

U.S. PATENT DOCUMENTS

| | | | |
|---|---|---|---|
| 5,584,396 A * | 12/1996 | Schmitt | H02B 1/36 211/26 |
| 10,645,837 B1 * | 5/2020 | Tsorng | H05K 5/0226 |
| 2011/0149501 A1 * | 6/2011 | Hughes | G11B 33/128 361/679.33 |
| 2016/0135322 A1 * | 5/2016 | Chen | G11B 33/128 361/679.46 |
| 2017/0269646 A1 * | 9/2017 | Zhai | H05K 7/1489 |

* cited by examiner

*Primary Examiner* — Rockshana D Chowdhury
*Assistant Examiner* — Christopher L Augustin
(74) *Attorney, Agent, or Firm* — Fogarty LLP (57) ABSTRACT

Information Handling Systems (IHSs), such as rack-mounted servers, may support various types of replaceable components that are installed in bays, such as storage drives and computing nodes. Some servers are constructed using a chassis that includes a front row of bays and an inner row of bays. In embodiments, in a closed position, the front row of bays conceals the inner row of bays until the front row of bays is rotated horizontally to an open position that provides access to the inner row of bays. The front row of bays may be divided into two banks of drive bays. The left and right banks of bays may be opened separately by rotating them horizontally about hinges connecting each bank to the chassis. By opening in this manner, the inner bays can be administered safely and limiting the forces placed on the chassis and the rack.

18 Claims, 5 Drawing Sheets

HORIZONTALLY OPENING FRONT BAYS

FIELD

This disclosure relates generally to Information Handling Systems (IHSs), and more specifically, to replaceable hardware components of IHSs.

BACKGROUND

As the value and use of information continues to increase, individuals and businesses seek additional ways to process and store information. One option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, global communications, etc. In addition, IHSs may include a variety of hardware and software components that may be configured to process, store, and communicate information and may include one or more computer systems, data storage systems, and networking systems.

Groups of IHSs may be housed within data center environments. A data center may include a large number of IHSs, such as servers that are stacked and installed within racks. A data center may include large numbers of such racks that may be organized into rows in a manner that allows administrators to access IHSs via both the front and back of a rack while those IHSs remain installed and operational. In certain instances, administrators may replace some components of rack-mounted IHSs while the an IHS remains operational and installed within its rack. Such IHS components may be referred to as being hot-pluggable. In other instances, administrators may remove a sever IHS from operation in order to replace some of its components. In either case, it is preferable that administrators be able to access such replaceable components of an IHS as easily and safely as possible within the constraints of a server IHS being installed within a rack of a densely packed data center.

SUMMARY

In various embodiments, Information Handling Systems (IHSs) supporting a plurality of replaceable components and also include: a chassis comprising a front row of bays and further comprising an inner row of bays; the front row of bays comprising a plurality of bays operable for installing replaceable components, wherein, in a closed position, the front row of bays conceals the inner row of bays, and wherein the front row of bays rotates horizontally to an open position that provides access to the inner row of bays; and the inner row of bays operable for installing replaceable components, wherein the inner row of bays is accessed by rotating the front row of drive bays horizontally.

In additional IHS embodiments, the front row of bays comprises a left bank of bays and further comprises a right bank of bays. In additional IHS embodiments, the left bank of bays is opened by rotating the left bank of bays horizontally towards the left of the chassis and wherein the right bank of bays is opened by rotating the right bank of bays horizontally towards the right of the chassis. In additional IHS embodiments, the left bank of bays is rotated about a left hinge connecting the left bank of bays to the chassis and wherein the right bank of bays is rotated about a right hinge connecting the right bank to the chassis. In additional IHS embodiments, the chassis further comprises a left cable channel separating the inner row of bays from the left side of the chassis and further comprises a right cable channel separating the inner row of bays from the right side of the chassis. In additional IHS embodiments, a first set of cables are routed from a rear compartment of the chassis to the left bank of bays via the left cable channel and wherein a second set of cables are routed from the rear compartment of the chassis to the right bank of bays via the right cable channel. In additional IHS embodiments, the front row of bays is rotated to an open position while the chassis remains at least partially within a slot of a rack. In additional IHS embodiments, the removeable components comprise a plurality of storage drives. In additional IHS embodiments, the front row of bays are externally accessible from the front of the chassis when in a closed position. In additional IHS embodiments, the left bank of bays is opened by rotating it marginally greater than 90 degrees from the closed position and wherein the right bank of bays is opened by rotating it marginally greater than 90 degrees from the closed position.

In various additional embodiments, chassis for one or more Information Handling Systems (IHSs) are provided. The chassis include: a front row of bays comprising a plurality of bays operable for installing replaceable components, wherein, in a closed position, the front row of bays conceals an inner row of bays, and wherein the front row of bays rotates horizontally to an open position that provides access to the inner row of bays; and the inner row of bays operable for installing replaceable components, wherein the inner row of bays is accessed by rotating the front row of drive bays horizontally.

In additional chassis embodiments, the front row of bays comprises a left bank of bays and further comprises a right bank of bays. In additional chassis embodiments, the left bank of bays is opened by rotating the left bank of bays horizontally towards the left of the chassis and wherein the right bank of bays is opened by rotating the right bank of bays horizontally towards the right of the chassis. In additional chassis embodiments, the left bank of bays is rotated about a left hinge connecting the left bank of bays to the chassis and wherein the right bank of bays is rotated about a right hinge connecting the right bank to the chassis. In additional embodiments, the chassis further include a left cable channel separating the inner row of bays from the left side of the chassis and further comprising a right cable channel separating the inner row of bays from the right side of the chassis. In additional chassis embodiments, the left cable channels support routing of cables from a rear compartment of the chassis to the left bank of bays and wherein the right cable channel supports routing of cables from the rear compartment of the chassis to the right bank of bays.

In various additional embodiments, methods are provided for servicing replaceable components a chassis comprising a front row of bays and further comprising an inner row of bays, the method comprising: opening the front row of bays by rotating a left bank of front bays horizontally towards the left of the chassis and by rotating a right bank of front bays horizontally towards the right of the chassis, wherein an inner row of bays is accessible by opening the front row of bays; servicing replaceable components in the inner row of bays while the front row of bays is opened; and closing the front row of bays by rotating the left bank of front bays horizontally towards the right of the chassis and by rotating the right bank of front bays horizontally towards the left of the chassis, wherein the inner row of bays is concealed by closing the front row of bays.

In additional embodiments methods may further include, pulling the chassis partially from an installed slot of a rack. In additional method embodiments, wherein the left bank of bays is rotated about a left hinge connecting the left bank of bays to the chassis and wherein the right bank of bays is rotated about a right hinge connecting the right bank to the chassis. In additional chassis embodiments, the chassis further comprises a left cable channel separating the inner row of bays from the left side of the chassis and further comprises a right cable channel separating the inner row of bays from the right side of the chassis.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources, such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components. An example of an IHS is described in more detail below. It should be appreciated that although certain IHSs described herein may be discussed in the context of an enterprise computing servers utilized in data centers, other embodiments may be utilized.

As described, a rack may house multiple different chassis and a data center may house numerous racks. Each rack may host a large number of IHSs that are installed as components of chassis, where the chassis are stacked and installed within racks. The front-side of such rack-mounted chassis may include one or more bays that each receive an individual sled (that may be additionally or alternatively referred to as a tray, drive, blade, and/or node), such as storage sleds and computing sleds, where these computing sleds may be their own IHSs that utilize network, power, cooling and other such shared resources from the rack-mounted chassis. In certain instances, a rack-mounted chassis A chassis may support a variety of different numbers (e.g., 4, 8, 16, 32), sizes (e.g., single-width, double-width), orientations and physical configurations of bays. Such sleds may be individually installed and removed from their respective bays provided by a chassis, thus allowing the computing and storage capabilities of a chassis to be reconfigured by swapping the sleds with different types of sleds.

By configuring a chassis with different sleds, the chassis may be adapted to support specific types of operations, thus providing a computing solution directed towards a specific type of computational task. For instance, a chassis that is configured to support artificial intelligence computing solutions may include compute sleds that include specialized artificial intelligence processors or other specialized artificial intelligence components, such as specialized FPGAs. In another example, a chassis may include compute sleds and storage sleds that support secure and isolated execution spaces for specific types of virtualized environments. A chassis may also be adapted for specific computing tasks through the use of different expansion cards that may be installed in expansion slots and expansion bays located in a rear compartment of a rack-mounted server IHS. For instance, a chassis configured to support specific data mining operations may include rear-mounted network controller expansion cards that support high-speed couplings with other similarly configured chassis, thus supporting high-throughput, parallel-processing computing solutions.

In support of such adaptable capabilities of such rack-mounted IHSs, data center administrators may regularly hot swap components, such as hot swapping storage drives installed in the front-facing bays of a server. In some instances, administrators may similarly hot-swap components from rear-facing bays, such as specific types of expansion cards that may provide an IHS with specialized capabilities. In some instances, server IHS may include bays that are not externally accessible while the server is installed within a rack with other servers stacked above and below. In such instances, a server IHS may only be partially removed from its position in a rack in order to access these inner drive bays, thus saving the time and effort required to fully disconnect and remove a server from its installed location and transport to a work area for service.

In a data center environment, each server is intended to remain in operation with as little down-time as possible, such that administrators prefer to service these servers without completely removing it from its rack. Such administration of rack-mounted servers is made more difficult since a server may be installed at various heights within a rack, which may be more than 6 feet tall. Adding to this difficulty, a sever is typically installed closely to other servers that are running and connected to various cables. In order for such tasks to be performed safely and reliably, administrators must be able to perform such tasks without great physical effort and without risk of falling and harming themselves or causing damage. As describe in additional detail below, embodiments provide a capability for safely and easily administering components installed within interior bays of a rack-mounted chassis.

Figure 1:
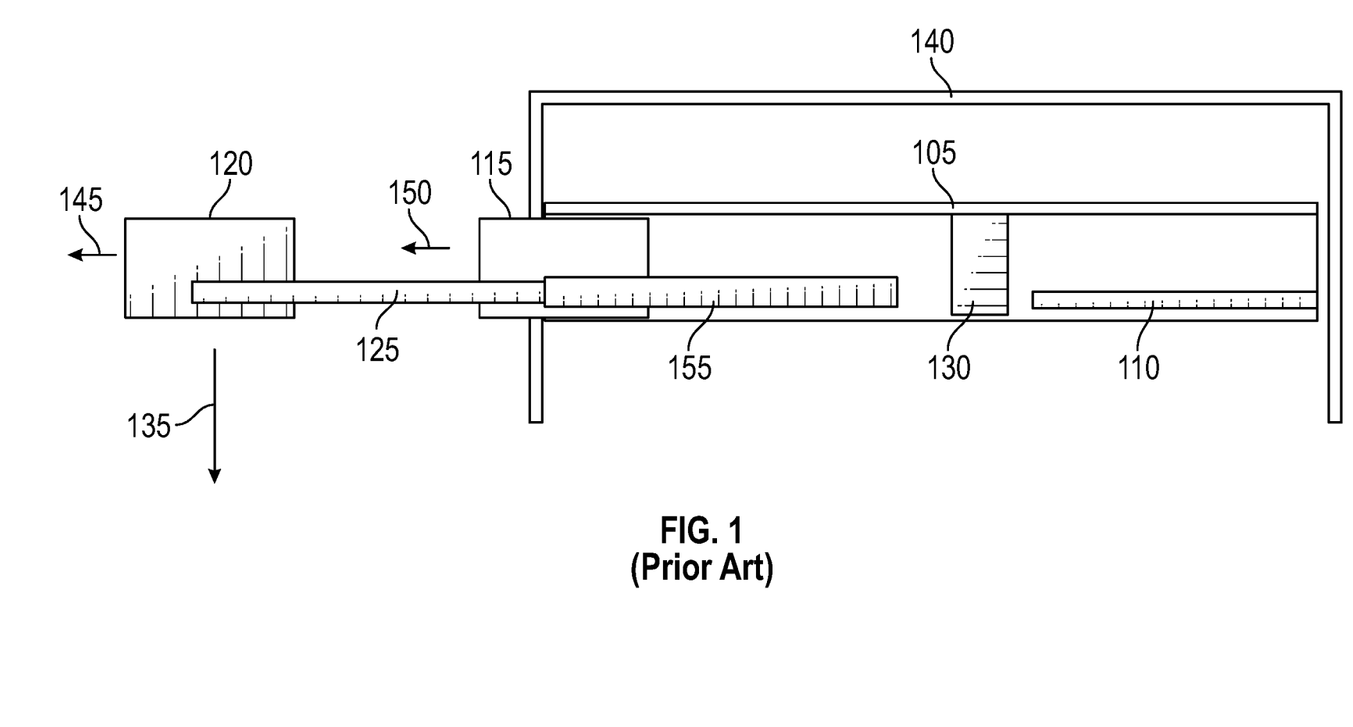
FIG. 1 is a side-view illustration of an existing rack-mounted server configuration that includes two rows of drive bays, where the inner row of drive bays is accessed by sliding the front row of drive bays forward.

FIG. 1 is a side-view illustration of an existing server configuration that includes two rows of drive bays, where the inner row of drive bays is accessed by sliding the front row of drive bays forward. As described, a rack 140 utilized in a data center environment may house a stack of servers, such as the single rack-mounted server 105 illustrated in FIG. 1. In many instances, a rack 140 may be filled with stacked servers, switches or various other components. The server 105 is installed within rack 140 by sliding the server 105 into a compatibly sized slot of the rack, where these slots that may be measured in terms of standardized rack units. The chassis of the server 105 may include external rails, not illustrated in FIG. 1, that are received by corresponding rails provided along the inner sides of rack 140.

As illustrated, a server 105 may include two main inner compartments. The rear compartment of server 105 may include a motherboard 110 to which includes various components and connectors that may support various types of expansion cards and cable connections. Some of these cable connections may extend to the front compartment of server 105, where these cables may be coupled to various different types of replaceable and non-replaceable components. The front and rear compartments may be separated by a midplane that may include a bank of fans 130 that are operated to ventilate heated air from within these inner compartments.

The front compartment of server 105 includes two rows of drive bays 120, 125 in which replaceable components, such as storage drives, may be installed. In the illustrated opened configuration of server 105, the two rows of drive bays 120, 125 have been pulled forward in a manner that allows replaceable components to be exchanged from the inner row of drive bays 115. When in a closed configuration, the inner row of drive bays 115 is pushed back into the front compartment of the server 105 and the front row of drive bays 120 is also pushed back into the front compartment of server 105. In a closed configuration, replaceable components can be exchanged from the front row of drive bays 120, but the inner row of drive bays 115 is not accessible. Accordingly, the service position illustrated in FIG. 1 allows the drive bays to be pulled from the front compartment of server 105 in the same manner that a drawer is opened. Once opened in this service position, replaceable components installed within the inner row of drive bays 115 may be removed by pulling the component in direction 150 from its respective drive bay. Whether opened or closed, replaceable components installed within the front row of drive bays 120 may be removed by pulling the component in direction 145 from its respective drive bay.

In order to support the opening of the front compartment of server 105 in the described manner, the front compartment may include a set of inner rails 155. The front drive bay 120 and the inner drive bay 115 may each be mounted on a set of the corresponding rails 125 that are received by inner rails 155 of the front compartment. Much like the use of slides in a conventional drawer, the front row of drive bays 120 may be pulled forward until the rails engage to also pull the inner row of drive bays 115 forward until it emerges, at least partially, from the inner compartment of the server 105. As illustrated, the action of the rails allows the front row of drive bays 120 to be pulled away from the inner row of drive bays 115 in order to provide space for an administrator to exchange replaceable components from the inner row of drive bays 115. In order to support such clearance for an administrator to access the inner row of drive bays 115, the front row of drive bays 120 must be extended considerably from the rack 140. In many instances, a front row of drive bays 120 may be filled with storage drives, resulting in the front row of drive bays 120 being of considerable weight.

As illustrated, the weight of the front row of drive bays 120 generates a downward force in direction 135. The further the front row of drive bays 120 is extended from the inner compartment of server 105, the greater the moment of the downward force generated by the extended drive bays. As the inner row of drive bays 115 is also extended from the inner compartment of server 105, it also contributes to the force in direction 135. As a result of extending the drive bays in this manner, significant amounts of force must be withstood by the inner rails 125, 155 of the inner compartment of server 105. Accounting for such forces requires use of sturdier, and thus more expensive, hardware for these inner rails 125, 155.

Figure 2:
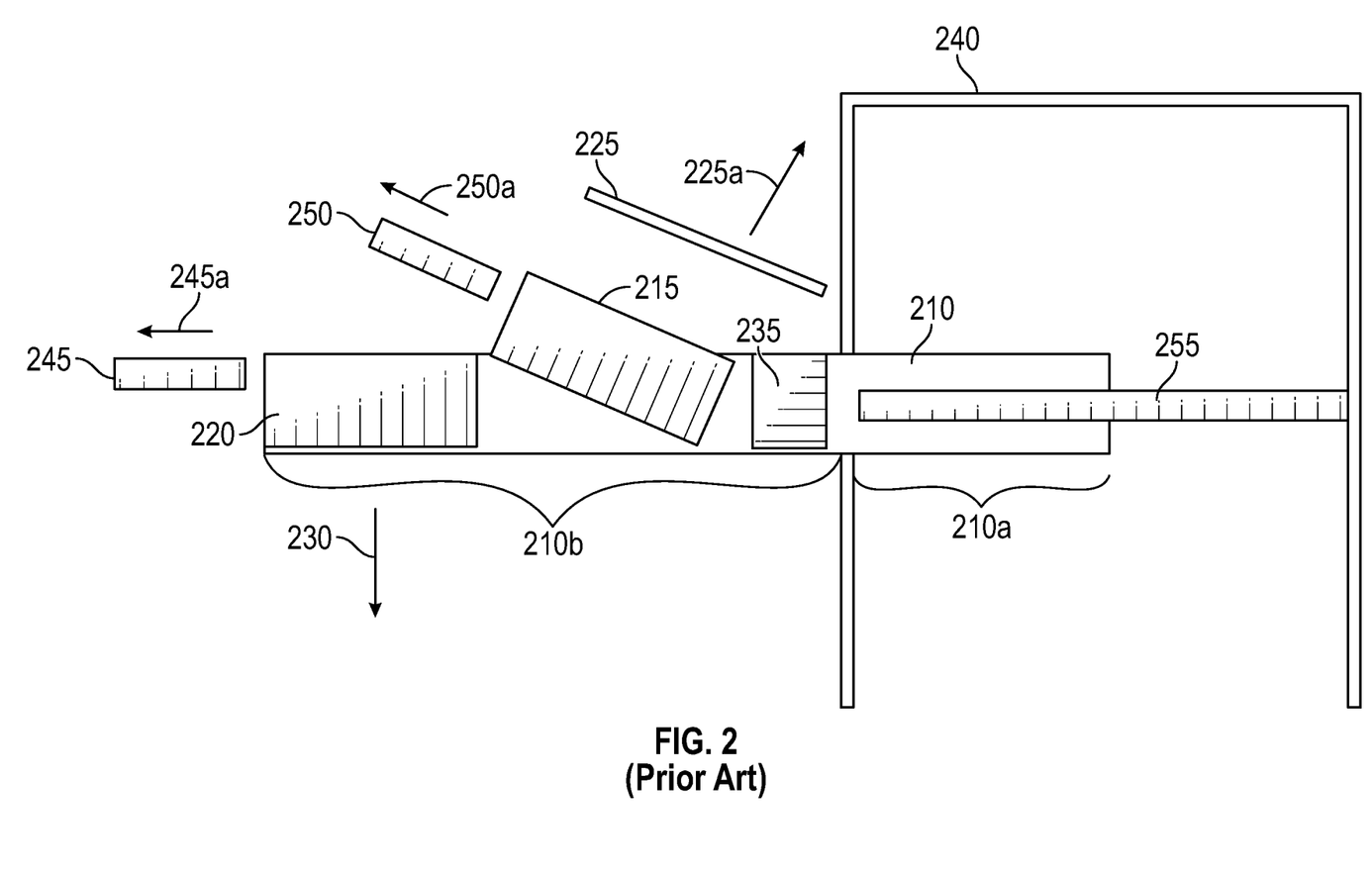
FIG. 2 is a side-view illustration of an additional existing server configuration that includes two rows of drive bays, where the inner row of drive bays is accessed by removing an access panel on top of the server.

FIG. 2 is a side-view illustration of another type of existing server configuration that includes two rows of drive bays, where the inner row of drive bays is accessed by removing an access panel on top of the server. As with the server of FIG. 1, the additional existing server 210 of FIG. 2 includes a rear compartment that is separated by a bank of fans 235, or other midplane, from a front compartment that houses replaceable components. The server 210 of FIG. 2 also supports a front row of drive bays 220 and an inner row of drive bays 215. However, rather than pull the inner drive bays out of the inner compartment in a drawer-like fashion, in the server 210 of FIG. 2, the inner row of drive bays 215 are accessed by removing a top cover 225, in direction 225a, of the chassis of rack server 210.

After the top cover 225 of rack server 210 is removed, the inner row of drive bays 215 may be rotated upwards such that components installed within the drive bays 215 can be exchanged. In FIG. 2, the inner row of drive bays 215 has been rotated upwards such that a storage drive 250 can be pulled in direction 250a by an administrator and removed from one of the inner drive bays. Similar to the rack server of FIG. 1, the front row of drive bays 220 can be accessed while rack server remains installed within the rack 240 or while the rack server 210 is in the service position illustrated in FIG. 2. For instance, storage drive 245 is removed from one of the front drive bays 220 by pulling it in direction 245a.

A significant disadvantage of the server 210 of FIG. 2 is the requirement that the server must be substantially removed from within its slot in rack 240 in order for top cover 225 to be removed as illustrated. In order to move server 210 into and out of a service position, external rails on the chassis of the server are slid along rails 255 on the inside of rack 240. In the illustrated service position, server 210 has been slid along the rails 225 of its slot in rack 240 until portion 210a remains within the rack 240 and held in place by rails 255 and portion 210b extends outside of rack 240. In many instances, the front drive bays 220 and inner drive bays 215 may each be filled with storage drives such that the combined weight of the drive bays 215, 210 and their contents generates a significant downward force in direction 230 when server 210 is in a service position. The further the server 210 is pulled from its slot in rack 240, the greater the portion 210b of the server that is contributing to this downward force 230. In this service position, the moment of force 230 results in significant stress on the external rails of the chassis of the server 210 and also on the corresponding rails 255 of the rack 240. Compensating for such forces requires sturdier and more expensive rail hardware to be utilized by both the rack server 210 and the rack 240.

As described, numerous servers, such as server 210, or other components may be stacked within a rack 240. Typical racks are constructed using standardized measurements that include standardized heights. A common rack of 42 rack units in height is over six feet tall. Accordingly, when installed at positions that are towards the top of such racks, a server may be installed above the eye level of many administrators. For existing servers such as illustrated in FIG. 2, accessing the top panel 225 of a server 210 that is installed near the top of the rack 240 is difficult for most administrators. In many instances, step stools or other aids are required for administrators to reach the top cover 225 of a server installed near the top of a rack. This poses both administrative burden and potential safety concerns that are exacerbated by the server 210 extending significantly from within the rack 240 when it is in the illustrated service position.

Figure 3A:
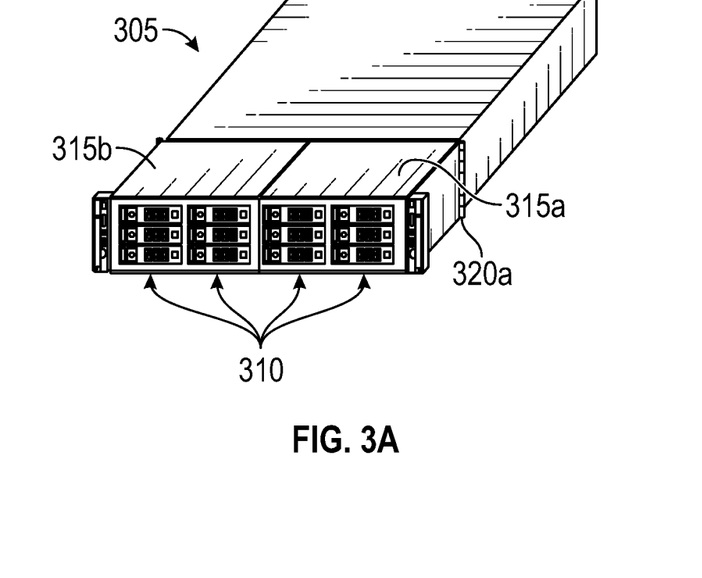
FIG. 3A is an illustration of an IHS that includes horizontally opening bays according to various embodiments, where the front row of bays is in a closed configuration.

FIG. 3A is an illustration of an IHS that includes horizontally opening bays according to various embodiments, where the front row of bays is in a closed configuration. In the embodiment of FIG. 3A, and IHS 305, such as a rack server, includes a front portion comprised of two banks 315a, 315b of front bays. The illustrated embodiment includes four columns 310 of bays within the front row of bays, with each of the banks 315a, 315b of bays being formed from two of these columns of bays. Embodiments may utilize various other configurations of bays. For instance, in some embodiments front bays may be oriented vertically instead of the horizontal orientation of the bays FIG. 3A. In other embodiments, different numbers of front bays may be utilized with different numbers of columns and different numbers of bays in each column than the 4x4 configuration of drives illustrated in FIG. 3A. When installed within a slot of a rack, IHS 305 is positioned such that an administrator can easily access the removable components installed within the two banks 315a, 315b of front bays.

Figure 3B:
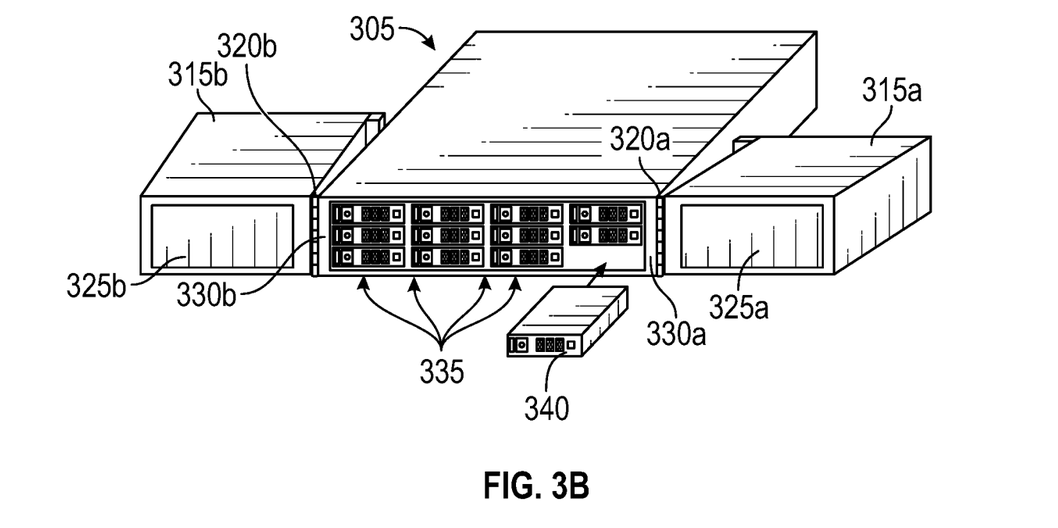
FIG. 3B is an illustration of an IHS that includes horizontally opening bays according to various embodiments, where the front row of bays is in an open configuration that exposes the inner row of bays.

FIG. 3B is an illustration of an IHS that includes horizontally opening bays according to various embodiments, where the front row of bays is in an open configuration that exposes the inner row of bays. In the closed configuration of FIG. 3A, administrators are limited to exchanging removable components in the two banks 315a, 315b of front bays, with the inner row of bays concealed by the closed front row of bays. In FIG. 3B, the left bank 315b of front bays has been rotated horizontally about a hinge 320b by which the left bank 315b of bays is attached to the chassis of the IHS 305. Similarly, the right bank 315a of front bays has been rotated horizontally about a hinge 320a by which the right bank 315a of bays is attached to the chassis of the IHS 305. As illustrated, in this open configuration, embodiments provide access to an inner row of bays 335.

While in this open configuration of FIG. 3B, and administrator may easily access and remove a replaceable component, such as storage drive 340, from a bay of the inner row of bays of IHS 305. As with the front bays 315a, 315b, embodiments may utilize various different numbers, configurations and orientations of bays in the inner row 335 of bays. As described, an IHS such as a server may be constructed with a rear compartment that houses a motherboard, various expansion cards and other systems. In order for bays in a front compartment of a server to be operational, cables are extended from the motherboard in the rear compartment to the bays in the front compartment. In the embodiment of FIG. 3B, cable channels 330a, 330b are included within the chassis on each side of the inner row of bays 335. Cables may be extended from the rear compartment of IHS 305 via the left cable channel 330b to a backplane 325b that is fixed to the back of the left bank 315b of front bays. The backplane 325b may include connectors that receive cables extended via cable channel 330b from the motherboard or from other components located in the rear compartment of IHS 305. In the same manner, cables may be extended, via a cable channel 330a located on the right of the inner row of bays 335, from the rear compartment of IHS 305 to a backplane 325a fixed to the back of the right bank 315a of front bays.

Figure 4A:
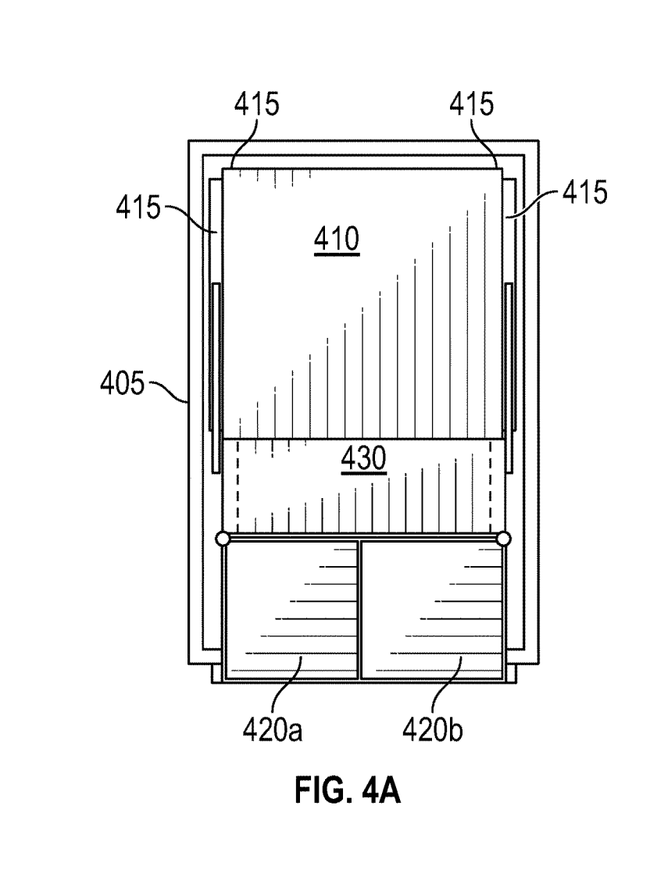
FIG. 4A is a top-view illustration of an IHS that includes horizontally opening drive bays according to various embodiments, where the front row of bays is in a closed configuration.

FIG. 4A is a top-view illustration of an IHS that includes horizontally opening bays according to various embodiments, where the front row of bays is in a closed configuration. In FIG. 4A, an IHS 410 according to embodiments is installed within a rack 405. As described, the chassis of the IHS 410 may include external rails 415 that are received by corresponding rails 415 of the rack 405. In the closed configuration of FIG. 4A, an administrator can access the removable components installed within a left bank 420a of front bays and/or within a right bank 420b of front bays. As illustrated, in the closed configuration of FIG. 4A, the inner row of bays 430 is concealed by the banks 420a, 420b of the front row of bays and are not accessible by administrators.

Figure 4B:
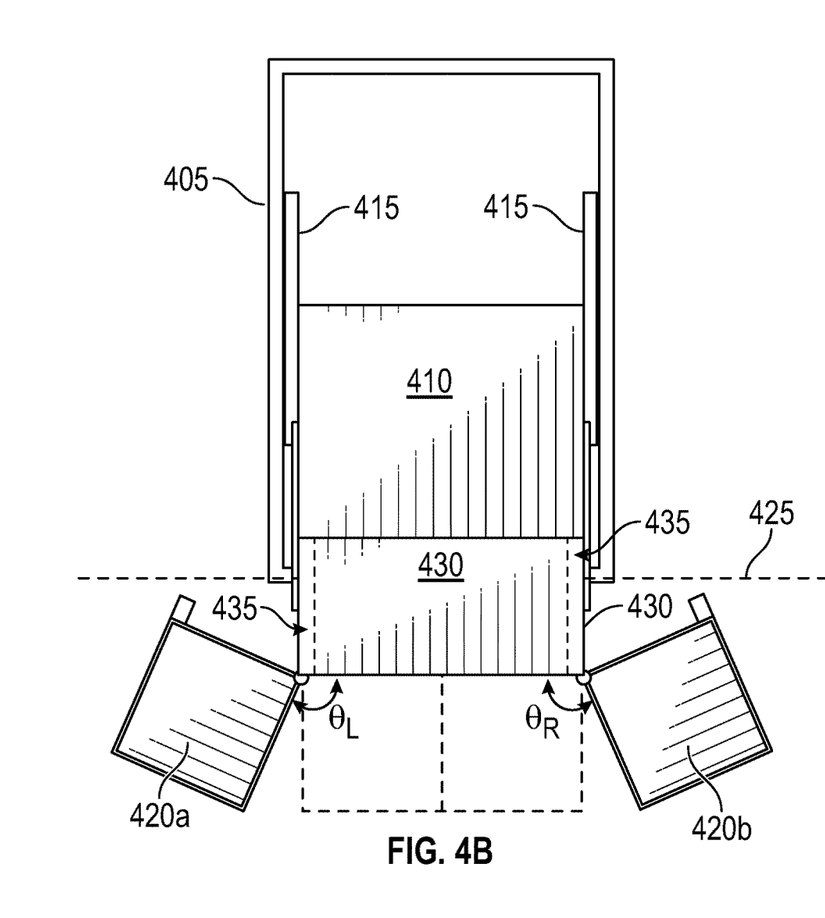
FIG. 4B is a top-view illustration of an IHS that includes horizontally opening bays according to various embodiments, where the front row of bays is in an open configuration.

FIG. 4B is a top-view illustration of an IHS that includes horizontally opening bays according to various embodiments, where the front row of bays is in an open configuration. In the open configuration, IHS 410 has been pulled forward partially out of its installed position in rack 405 by sliding it along the corresponding rails 415 of the chassis of IHS 410 and rack 405. As illustrated, with IHS 410 pulled forward manner, the front banks of bays 420a and 420b are rotated horizontally in order to gain access to the inner row of bays 430. As illustrated, the left bank 420a of front bays is opened by rotating the left bank 420a horizontally towards the left of the chassis about the hinge connecting the left bank 420a of bays to the chassis of IHS 410. Similarly, the right bank 420b of front bays is opened by rotating right bank 420b horizontally towards the right of the chassis about the hinge connecting the right bank 420a to the chassis. The IHS 410 is returned to a closed position by reversing this rotation of the right and left banks 420a, 420b of front bays.

As illustrated in FIG. 4B, and administrator can access all of the bays of the inner row 430 once the left 420a and right 420b banks of front bays have been rotated past 90 degrees from their closed position. As described, cables may be extended from a rear compartment of an IHS 410 to the banks 420a, 420b of front bays via cable channels 435 that are provided on each side of the inner row of bays 430. The cables extended via the channels 435 may be coupled to connectors provided by a backplane that may be fixed to the back of each of the banks 420*a*, 420*b* of the front row of bays. Providing clearance from these backplanes and cabling, and thus to provide access to all of the bays of the inner row 430, may require rotation of the banks 420*a*, 420*b* past 90 degrees from their closed position. However, embodiments support providing unencumbered access to the inner row of bays 430 with rotation of the banks 420*a*, 420*b* of the front row bays only a few degrees past 90 degrees. As a result, the IHS 410 need only be pulled from rack 405 enough to provide clearance for rotating the front banks 420*a*, 420*b* of bays just past 90 degrees from their closed positions.

In the open configuration illustrated in FIG. 4B, IHS 410 is pulled from rack 405 until the banks 420*a*, 420*b* of the front row of bays may each be opened from their closed positions sufficient to provide clearance for accessing the bays of the inner row 430. As illustrated, each of the banks 420*a*, 420*b* of front row bays are opened sufficient to access the inner row 430 of drive bays without the opened banks 420*a*, 420*b* breaking plane 425 which represents the front face of rack 405 and adjacent racks that may be installed on each side of rack 405. As illustrated, the opening of the banks 420*a*, 420*b* of front row bays may be achieved without having to fully extract the inner row of bays 430 from within the rack 405. As a result, at least a portion of the weight of the inner row of bays 430 remain supported by the rails 415 while an administrator accesses inner row of bays 430. In comparison to the existing top-cover configuration of FIG. 2, embodiments allow the inner row of drive bays 430 to be accessed while a greater portion of the IHS 410 remains within its slot in rack 405. In comparison to the existing drawer-like configuration of FIG. 1, embodiments allow the inner row of drive bays 430 to be accessed without having to extend the front row of bays as far from the chassis, thus reducing the moment of the downward force generated by the front row of bays while the chassis is in a service position. With less of the weight of IHS 410 being pulled from rack 405 and a reduced moment of the downward force generated by opening the front row of bays, embodiments generate less downward force on the rails holding the IHS 410 in place within rack 405 compared to the existing configurations FIGS. 1 and 2.

Figure 5:
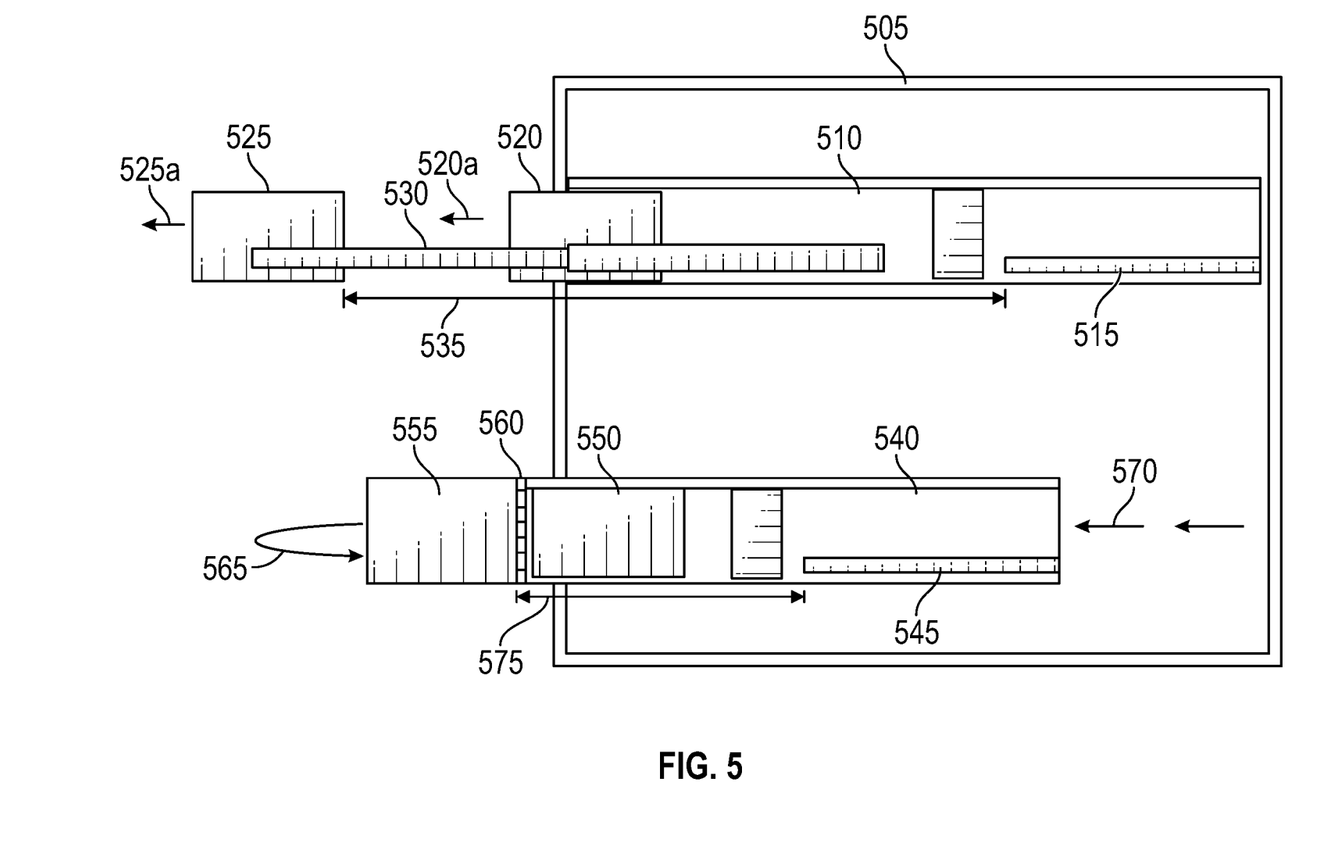
FIG. 5 is a side-view illustration of that compares the operation of an existing configuration that includes two rows of bays and an IHS according to embodiments that includes horizontally opening bays.

FIG. 5 is a side-view illustration of that compares the operation of an existing configuration that includes two rows of bays and an IHS according to embodiments that includes horizontally opening bays. In FIG. 5, rack 505 includes an existing server 510 that operates in the same manner as the server of FIG. 1. The rack 505 of FIG. 5 also includes server IHS 540 according to embodiments that operates as described with regard to FIGS. 3A, 3B, 4A, 4B. As described with regard to FIG. 1, server 510 includes an inner set of rails 530 that allows an inner row of bays 520 and a front row of bays 525 to be pulled from a front compartment of the server 510. Extended from the front compartment of server 510 in this manner, an administrator may pull drives from the inner row of bays 520 in direction 520*a* and the from the front row of bays 525 in direction 525*a*. In order to support the operation of bays of the existing server 510, cables are extended from a motherboard 515 in the rear compartment to each of the rows of bays.

As illustrated, in order for cables to remain connected to the drives of the front bays 525 while in the illustrated service position of server 510, the cables must be of sufficient length 535 to extend from the motherboard all the way to the fully extended position of the front row of bays 525. Such a configuration thus requires use of longer, more expensive cables, especially for the front bays 525. For certain high-speed cabling, longer cables may result in degraded signal quality compared to shorter cables. In addition, accommodating the extraction of the bays 525, 520 from the front compartment of server 510 as in the service position illustrated in FIG. 5 requires significant slack in the cabling utilized by the bays. When the bays 525, 520 are pushed back into the front compartment of server 510 to return them to a closed position, the slack in the cables required to support the service position must now be accounted for with regards to storage space and preventing the slack in the cables from binding or otherwise jamming the movement of the drive bays 525, 520 back to a closed position. Thus, the considerable slack required for cabling in the existing server 510 may result in damage to the cables and/or the rail system 530.

As illustrated, rack 505 also includes a server IHS 540 according to embodiments. The IHS 505 has been moved forward in direction 570 to the illustrated service position where an administrator can open the front bays 555 horizontally. For instance, the right bank of front bays is opened by rotation in direction 565 about hinge 560. In the existing server 510, the inner row of bays 520 is pulled outwards from its stored position within the front compartment, thus allowing the inner row of bays 550 to be reached by an administrator. In order support such movement by the inner row of bays 550 of an existing server, the cabling used to connect the inner row of bays 520 to a motherboard does require some slack in order to account for this movement. In the IHS 540 according to embodiments, on the other hand, the inner row of bays 550 remains in a fixed positions such that cabling used by the inner row of bays 550 requires only minimal slack and does not pose problems with regard to binding of these cables. Also as illustrated, in the IHS 540 according to embodiments, the cabling that extends from the motherboard 545 in the rear compartment to the front row of bays 555 is much shorter 575 than the length 535 of cabling used by the front row of bays 525 in an existing server 510.

As described with regard to FIG. 3B, embodiments may include cable channels within the chassis on each side of the inner row of bays 550, thus providing a space for cables to be extended from the motherboard 545 to the front row of bays 555. These cables utilized by the front row of bays 555 may be received by connectors located on a backplane of each bank of the front bays. These cables require some slack in order to account for the banks of front bays 555 swinging horizontally into a service position, but this amount of slack is considerably shorter than that required in an existing server 510 configuration. With less slack and a shorter range of motion by the horizontally opening front bays when compared to the existing configuration, there is less change of binding of cables, thus reducing the opportunity for damage and simplifying administration of the inner row of bays.

The illustrated embodiments include a front row of bays that is divided into two banks of bays, with each bank of bays being opened by rotation about hinges on respective sides of the chassis. Certain embodiments may instead utilize a single bank of front bays that is attached to the chassis via a single hinge on either the right or left side of the chassis. In such embodiments, administrators may access the concealed inner row of bays by rotating the entire front row of bays about this single hinge. Such embodiments may require sturdier hinges capable of supporting the full weight of the entire front row of bays. In such embodiments, cables may be extended from the rear compartment of the IHS to the front row of bays via a cable channel located on the same side of the chassis as the hinge used to open and close the front row of bays.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS) supporting a plurality of replaceable components, the IHS comprising:
   a chassis comprising a front row of bays and further comprising an inner row of bays;
   the front row of bays comprising a plurality of bays operable for installing replaceable components, wherein, in a closed position, the front row of bays conceals the inner row of bays, and wherein the front row of bays rotates horizontally to an open position that provides access to the inner row of bays, and wherein the front row of bays comprises a left bank of bays and further comprises a right bank of bays, wherein the replaceable components are installed in the plurality of bays of the front row while the front row of bays is in the closed position that conceals the inner row of bays; and
   the inner row of bays operable for installing replaceable components, wherein the inner row of bays is accessed by rotating the front row of drive bays horizontally.

2. The IHS of claim 1, wherein the left bank of bays is opened by rotating the left bank of bays horizontally towards the left of the chassis and wherein the right bank of bays is opened by rotating the right bank of bays horizontally towards the right of the chassis.

3. The IHS of claim 2, wherein the left bank of bays is rotated about a left hinge connecting the left bank of bays to the chassis and wherein the right bank of bays is rotated about a right hinge connecting the right bank of bays to the chassis.

4. The IHS of claim 3, wherein the left bank of bays is opened by rotating it marginally greater than 90 degrees from the closed position and wherein the right bank of bays is opened by rotating it marginally greater than 90 degrees from the closed position.

5. The IHS of claim 1, wherein the chassis further comprises a left cable channel separating the inner row of bays from the left side of the chassis and further comprises a right cable channel separating the inner row of bays from the right side of the chassis.

6. The IHS of claim 5, wherein a first set of cables are routed from a rear compartment of the chassis to the left bank of bays via the left cable channel and wherein a second set of cables are routed from the rear compartment of the chassis to the right bank of bays via the right cable channel.

7. The IHS of claim 1, wherein the front row of bays is rotated to an open position while the chassis remains at least partially within a slot of a rack.

8. The IHS of claim 1, wherein the replaceable components comprise a plurality of storage drives.

9. The IHS of claim 1, wherein the front row of bays are externally accessible from the front of the chassis when in a closed position.

10. A chassis for one or more Information Handling Systems (IHSs), the chassis comprising:
    a front row of bays comprising a plurality of bays operable for installing replaceable components, wherein, in a closed position, the front row of bays conceals an inner row of bays, and wherein the front row of bays rotates horizontally to an open position that provides access to the inner row of bays, and wherein the front row of bays comprises a left bank of bays and further comprises a right bank of bays, wherein the replaceable components are installed in the plurality of bays of the front row while the front row of bays is in the closed position that conceals the inner row of bays; and
    the inner row of bays operable for installing replaceable components, wherein the inner row of bays is accessed by rotating the front row of drive bays horizontally.

11. The chassis of claim 10, wherein the left bank of bays is opened by rotating the left bank of bays horizontally towards the left of the chassis and wherein the right bank of bays is opened by rotating the right bank of bays horizontally towards the right of the chassis.

12. The chassis of claim 11, wherein the left bank of bays is rotated about a left hinge connecting the left bank of bays to the chassis and wherein the right bank of bays is rotated about a right hinge connecting the right bank of bays to the chassis.

13. The chassis of claim 10, further comprising a left cable channel separating the inner row of bays from the left side of the chassis and further comprising a right cable channel separating the inner row of bays from the right side of the chassis.

14. The chassis of claim 13, wherein the left cable channel supports routing of cables from a rear compartment of the chassis to the left bank of bays and wherein the right cable channel supports routing of cables from the rear compartment of the chassis to the right bank of bays.

15. A method for servicing replaceable components of a chassis comprising a front row of bays and further comprising an inner row of bays, the method comprising:
    installing one or more replaceable components in the front row of bays while the front row of bays is in a closed position that conceals the inner row of bays;
    opening the front row of bays by rotating a left bank of front bays horizontally towards the left of the chassis and by rotating a right bank of front bays horizontally towards the right of the chassis, wherein an inner row of bays is accessible by opening the front row of bays;
    servicing replaceable components in the inner row of bays while the front row of bays is opened; and
    closing the front row of bays by rotating the left bank of front bays horizontally towards the right of the chassis and by rotating the right bank of front bays horizontally towards the left of the chassis, wherein the inner row of bays is concealed by closing the front row of bays.

16. The method of claim 15, further comprising pulling the chassis partially from an installed slot of a rack.

17. The method of claim 15, wherein the left bank of bays is rotated about a left hinge connecting the left bank of bays to the chassis and wherein the right bank of bays is rotated about a right hinge connecting the right bank of bays to the chassis.

18. The method of claim 15, wherein the chassis further comprises a left cable channel separating the inner row of bays from the left side of the chassis and further comprises a right cable channel separating the inner row of bays from the right side of the chassis.

* * * * *